United States Patent
Van Treuren et al.

(10) Patent No.: US 7,265,556 B2
(45) Date of Patent: Sep. 4, 2007

(54) SYSTEM AND METHOD FOR ADAPTABLE TESTING OF BACKPLANE INTERCONNECTIONS AND A TEST TOOL INCORPORATING THE SAME

(75) Inventors: Bradford G. Van Treuren, Lambertville, NJ (US); Paul J. Wheatley, Titusville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 24 days.

(21) Appl. No.: 11/237,083

(22) Filed: Sep. 28, 2005

(65) Prior Publication Data

US 2007/0069737 A1 Mar. 29, 2007

(51) Int. Cl.
G01R 31/04 (2006.01)
G01R 31/02 (2006.01)

(52) U.S. Cl. ...................... 324/538; 324/537

(58) Field of Classification Search ............. 324/538, 324/754, 755, 763, 537; 361/788
See application file for complete search history.

(56) References Cited

U.S. PATENT DOCUMENTS

| | | | |
|---|---|---|---|
| 3,784,910 A * | 1/1974 | Sylvan | 324/500 |
| 6,122,756 A * | 9/2000 | Baxter et al. | 714/30 |
| 6,350,130 B1 * | 2/2002 | Eller | 439/61 |
| 6,975,130 B2 * | 12/2005 | Yevmenenko | 324/765 |
| 2003/0074178 A1 * | 4/2003 | Sample et al. | 703/25 |
| 2004/0008034 A1 * | 1/2004 | Mastoris et al. | 324/538 |
| 2004/0230880 A1 * | 11/2004 | Co et al. | 714/724 |
| 2006/0140211 A1 * | 6/2006 | Huang et al. | 370/466 |

* cited by examiner

Primary Examiner—Anjan Deb

(57) ABSTRACT

The present invention provides a system for, and method of, adaptable testing of backplane interconnections. In one embodiment, the system includes a board detector configured to determine a relative arrangement of a plurality of hardware boards populating positions associated with the backplane interconnections. Additionally, the system also includes a test coordinator coupled to the board detector and configured to adaptively backplane test at least a pair of the plurality of hardware boards based on the relative arrangement.

20 Claims, 3 Drawing Sheets

SYSTEM AND METHOD FOR ADAPTABLE TESTING OF BACKPLANE INTERCONNECTIONS AND A TEST TOOL INCORPORATING THE SAME

TECHNICAL FIELD OF THE INVENTION

The present invention is directed, in general, to system hardware testing and debugging and, more specifically, to a system and method for adaptable testing of backplane interconnections and a test tool incorporating the system or the method.

BACKGROUND OF THE INVENTION

Testing of hardware wiring boards in a system has become increasingly more difficult to accomplish wherein key prerequisites include an appropriate level of testing that is accomplished in a timely manner. This is due, mainly, to an increasing complexity of the wiring boards brought about by smaller and more complex board components. There are manually created test solutions or the use of special fixturing to an In-Circuit Tester for a specific slot configuration. The manually created tests, often using an automatically controlled probe, are becoming more difficult due to this more complex technology. In some cases, the probe is not physically small enough to appropriately contact the interconnections between the smaller circuit components. Additionally, when a large number of circuit boards need to be tested, manual testing is often too time consuming. The special fixturing approach may entail a physical modification of the boards to be tested, which could add non-functional failure modes.

These testing modes have brought about the use of components having built-in testing circuitry that allows more automated testing of the circuit boards. These components are generally referred to as boundary scan components, and the IEEE Standard 1149.1 governing design, registers, protocols and testing of boundary scan components is employed. Some commercial boundary scan tool suppliers have developed methods to adapt board level test generation to a backplane. Unfortunately, all these solutions assume there is a fixed or set configuration of boards in backplane slots that will not change. Thus, these solutions will not be able to adapt to the need where a system may require multiple configurations in a given backplane depending on a customer's order (e.g., telecommunications systems).

Accordingly, what is needed in the art is an enhanced way to provide testing support for all system configurations that may be provided in a common backplane.

SUMMARY OF THE INVENTION

To address the above-discussed deficiencies of the prior art, the present invention provides a system for adaptable testing of backplane interconnections. In one embodiment, the system includes a board detector configured to determine a relative arrangement of a plurality of hardware boards populating positions associated with the backplane interconnections. Additionally, the system also includes a test coordinator coupled to the board detector and configured to adaptively backplane test at least a pair of the plurality of hardware boards based on the relative arrangement.

In another aspect, the present invention provides a method for adaptable testing of backplane interconnections. The method includes determining a relative arrangement of a plurality of hardware boards populating positions associated with the backplane interconnections and adaptively backplane testing at least a pair of the plurality of hardware boards based on the relative arrangement.

The present invention also provides, in yet another aspect, a test tool that includes a test database, which provides a backplane positions table and a backplane test data table and a system for adaptable testing of backplane interconnections. The system has a board detector that determines a relative arrangement of a plurality of hardware boards populating positions associated with the backplane interconnections. The system also has a test coordinator, coupled to the board detector, that adaptively backplane tests at least a pair of the plurality of hardware boards based on the relative arrangement.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
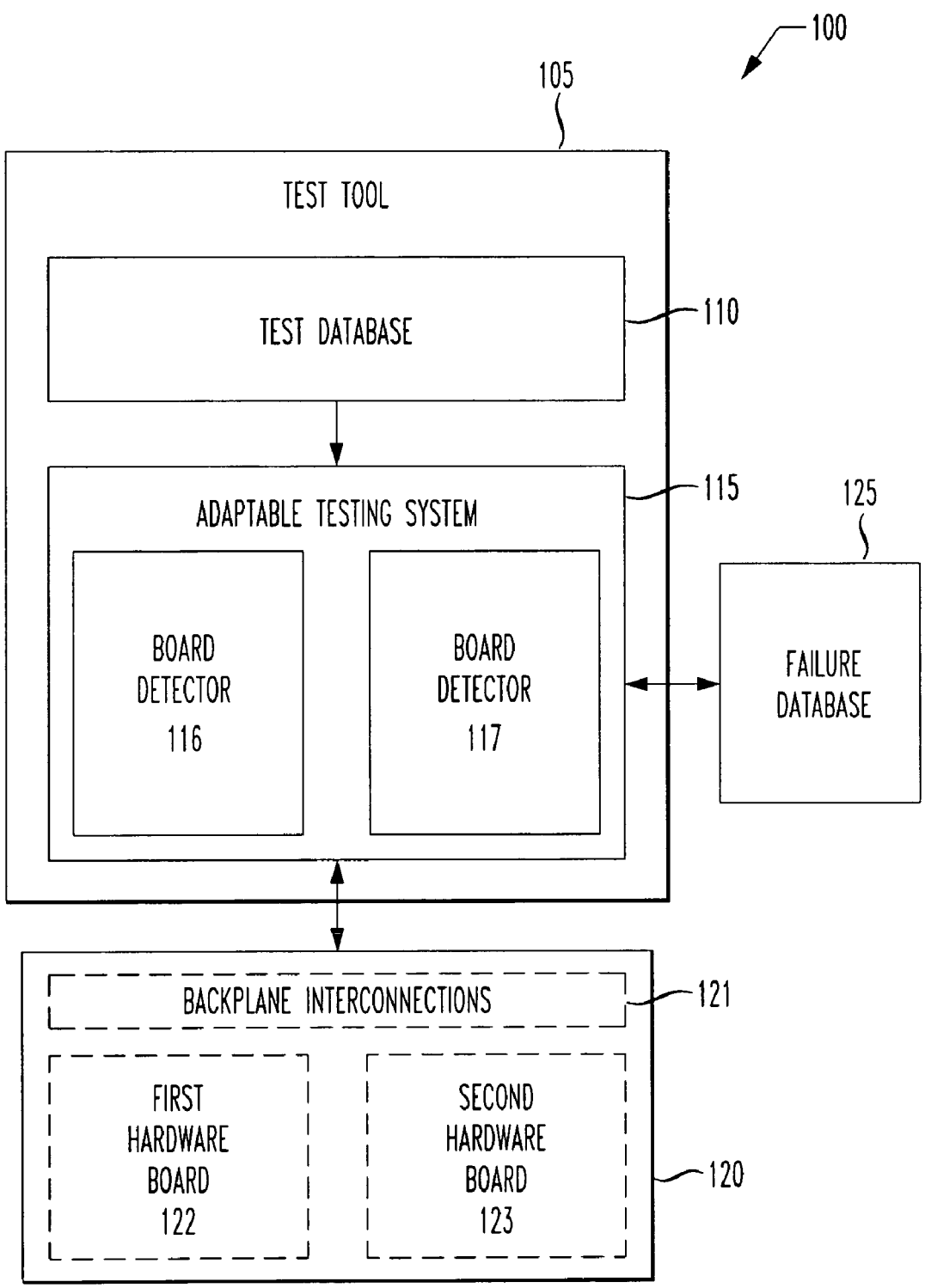
FIG. 1 illustrates a block diagram of an embodiment of a test system constructed in accordance with the principles of the present invention.

Referring initially to FIG. 1, illustrated is a block diagram of an embodiment of a test system, generally designated 100, constructed in accordance with the principles of the present invention. The test system 100 includes a test tool 105 for use with a backplane 120 and a failure database 125. The illustrated exemplary system is intended to be extremely generic and is capable of performing tests on at least a pair of hardware boards coupled to the backplane 120. The test tool includes a test database 110 and a system for adaptable testing of backplane interconnections 115 (adaptable testing system 115) having a board detector 116 and a test coordinator 117. The backplane 120 includes board slots having backplane interconnections 121 and first and second hardware boards 122, 123 coupled to the backplane interconnections 121.

The illustrated embodiment of the present invention employs the IEEE standard 1149.1 boundary scan technology. Additionally, test algorithms such as Walking 0, Walking 1, Up Count, Down Count, and Wagner or a proprietary test algorithm may be employed, as may be appropriate to a particular application. Embodiments of the present invention automatically determine the arrangement or configuration of hardware boards in the backplane 120 and apply the appropriate backplane pair-wise board tests needed to ensure proper operation. Additionally, these tests provide data necessary to diagnose a fault or failure.

second hardware board, an address of the second hardware board and any predecessor test number associated with the test number.

TABLE 2

| TEST NUMBER | TEST NAME | BOARD1 NAME | BOARD1 ADDRESS | BOARD2 NAME | BOARD2 ADDRESS | PREDECESSOR TEST NUMBER |
|---|---|---|---|---|---|---|
| 1 | CHAN1_CLCK1 | CHAN1 | 0x10 | CLCK1 | 0x20 | 0 |
| 2 | CHAN1_CLCK2 | CHAN1 | 0x10 | CLCK2 | 0x21 | 0 |
| 3 | CHAN2_CLCK1 | CHAN2 | 0x11 | CLCK1 | 0x20 | 0 |
| 4 | CHAN2_CLCK2 | CHAN2 | 0x11 | CLCK2 | 0x21 | 0 |
| 5 | CHAN3_CLCK1 | CHAN3 | 0x13 | CLCK1 | 0x20 | 0 |
| 6 | CHAN3_CLCK2 | CHAN3 | 0x13 | CLCK2 | 0x21 | 0 |
| 7 | CHAN4_CLCK1 | CHAN4 | 0x13 | CLCK1 | 0x20 | 0 |
| 8 | CHAN4_CLCK2 | CHAN4 | 0x13 | CLCK2 | 0x21 | 0 |
| 9 | CHAN1_CHAN2 | CHAN1 | 0x10 | CHAN2 | 0x11 | 0 |
| 10 | CHAN2_CHAN3 | CHAN2 | 0x11 | CHAN3 | 0x12 | 0 |
| 11 | CHAN3_CHAN4 | CHAN3 | 0x13 | CHAN4 | 0x13 | 0 |
| 12 | CHAN1_CHAN3 | CHAN1 | 0x10 | CHAN3 | 0x12 | 10 |
| 13 | CHAN2_CHAN4 | CHAN2 | 0x11 | CHAN4 | 0x13 | 11 |

The test tool 105 provides structural testing of backplane interconnections within a system using either existing or customized circuit boards. Testing goals include detecting any opens, shorts or stuck-at values and diagnosing which board, device, pin and net is associated with the fault on the backplane or adjoining circuitry. Most systems will have an array of slots into which hardware boards of various types may be inserted. The configuration of the system at the time of the test will typically be unknown. At run-time, embodiments of the invention first determine how the system is configured and then apply all the appropriate tests on pairs of boards, based on this configuration. Additionally, associated software employed to apply the tests may be applied either externally, such as with a PC, or embedded using the existing resources of the system to be tested.

The test database provides a backplane positions table and a backplane test data table corresponding to test board slots of the backplane 120 and the backplane interconnections 121. An example of the backplane positions table is shown in Table 1 below.

TABLE 1

| SLOT ID | ADDRESS | BOARD NAME | TEST NAME |
|---|---|---|---|
| 1 | 0x10 | CHAN1 | spchan |
| 2 | 0x11 | CHAN2 | spchan |
| 3 | 0x12 | CHAN3 | spchan |
| 4 | 0x13 | CHAN4 | spchan |
| 5 | 0x20 | CLCK1 | spclck |
| 6 | 0x21 | CLCK2 | spclck |

The backplane positions (or slots) table describes all testable slots associated with the backplane 120. Additionally, corresponding preliminary board tests to determine if a particular board is a candidate to participate in a system level test are also included. The backplane positions of Table 1 lists a slot identification number, address of the board in that slot, board name and any test that is first performed on the hardware board before using it for backplane test purposes.

The backplane test data table describes what backplane tests may be applied for any board pairs that are present in the system. An example of the backplane test data table is shown in Table 2 below. The backplane test data of Table 2 lists a test number, a test name, a name of a first hardware board, an address of the first hardware board, a name of a These tables are coded into a binary form together with all the tests that can be applied and entered into a single test repository. This can then be stored on either a local flash file system, downloaded and copied into RAM memory or stored on an external server. The driving test software may then read from this repository and apply the appropriate tests based on the automatically determined system configuration.

The board detector 116 determines a relative arrangement of a plurality of hardware boards populating positions associated with the backplane interconnections 121 in the backplane 120. To determine the system configuration of the hardware boards, each backplane slot is "pinged" using the supplied address to determine if it is populated with a hardware board, wherein this information is recorded for future use. Additionally, any test listed with the hardware board located in this backplane slot will be applied at this time, as referenced in Table 1. This test may be a test of the integrity of the boundary scan chain (path integrity test) on the board that is used for all subsequent testing, as well as, any routine to disable the board from the system (disable test) to ensure that it is not driving on the backplane during tests of other hardware boards. The board detector 116 thereby determines whether each of the plurality of hardware boards is usable for backplane testing.

The test coordinator 117 is coupled to the board detector 116 and adaptively backplane tests at least a pair of the plurality of hardware boards based on the relative arrangement, represented in the illustrated embodiment by the first and second hardware boards 122, 123. After the board detector 116 determines the system configuration, the test coordinator 117 employs data from the backplane test data of Table 2 to iteratively execute the required backplane test based on the availability of the hardware boards.

The backplane test data Table 2 includes a field at the end that lists any predecessor test. The purpose of this field is to eliminate any redundant tests that may have already covered backplane nets in a previous test. For example, in some systems a test may be used to test connections between adjacent pairs of hardware boards in a system. Also, there may be a test that will test the same nets with a test between boards that are separated by one slot. The testing of one hardware board to another hardware board where an empty slot exists between them only needs to be applied if the pair wise tests between the adjacent slots are not able to be performed due to an unpopulated slot. If all three slots are populated, the populated/missing/populated test is redundant because the connections are tested with the adjacent hardware board tests. The test coordinator 117 first determines if a predecessor test has been executed before applying a backplane test employing the first and second hardware boards 122, 123.

The failure database 125 serves as a repository for correlating fault conditions with hardware board and related backplane failures thereby allowing correlation between the two. The failure database 125 may be a generic database covering a broad variety of testing situations that has been acquired over extensive testing time. Alternatively, the failure database 125 may be focused on a particular backplane and subsets of applicable hardware boards. Of course, the failure database 125 may be a hierarchal structuring of the two as appropriate to a particular application.

Figure 2A:
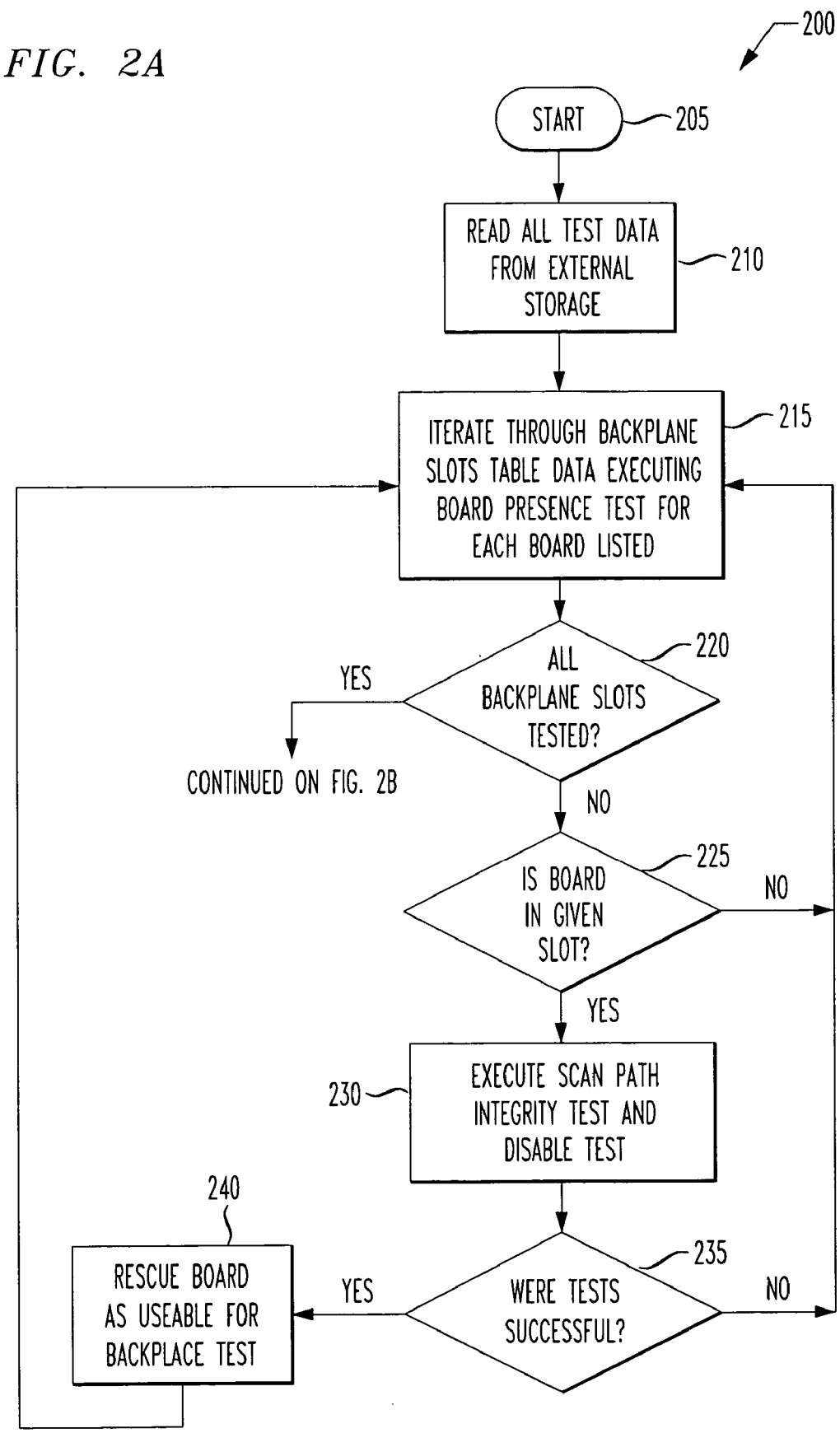
FIGS. 2A and 2B illustrate a flow diagram of an embodiment of a method of adaptable testing of backplane interconnections carried out in accordance with the principles of the present invention.
Figure 2B:
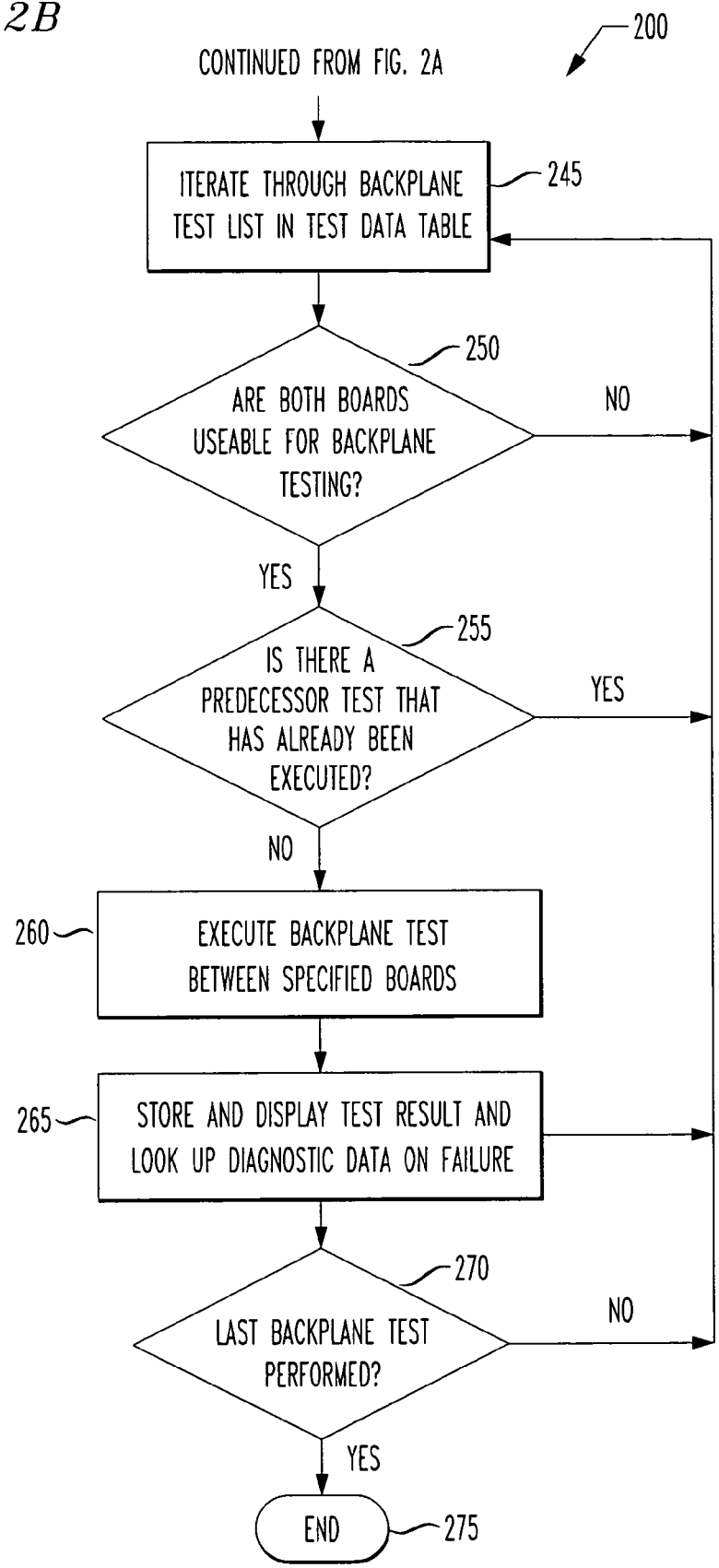

Turning now to FIGS. 2A and 2B, illustrated is a flow diagram of an embodiment of a method of adaptable testing of backplane interconnections, generally designated 200, carried out in accordance with the principles of the present invention. FIG. 2A shows a portion of the method 200 that may be employed in determining a relative arrangement of a plurality of hardware boards populating positions or slots associated with the backplane interconnections. FIG. 2B shows a portion of the method 200 that may be employed in adaptively backplane testing at least a pair of the plurality of hardware boards based on the relative arrangement.

The method 200 starts in a step 205. In a step 210, all test data is initially read from external storage. Then, in a step 215, backplane slots table data obtained in the step 210 is employed to iterate through each of the backplane slots executing a board presence test for each hardware board listed. A decisional step 220 determines if all of the backplane slots have been tested. If there are remaining backplane slots to be tested, a decisional step 225 determines if a hardware board is present in the backplane slot presently being addressed. If a hardware board is not present, the method 200 returns to the step 215 and proceeds to the next backplane slot. If the backplane slot contains a hardware board, a scan path integrity test and a disable test are executed on the hardware board, in a step 230.

Then, in a decisional step 235, it is determined if the tests were successful. If a hardware board in a slot does not respond to a common addressing scheme based on the slot number, the slot is assumed to be unpopulated. If any of the scan path integrity test or disable test fails, backplane testing cannot proceed because the state of the backplane signals from that slot is undefined. If the tests were not successful in the decisional step 235, the method 200 again returns to the step 215 wherein the next backplane slot is addressed, as before. If the tests were successful, the hardware board is recorded as usable for backplane testing in the step 240 and the method 200 returns to the step 215 for further action. If the decisional step 220 determines that all backplane slots have been addressed, the method 200 continues with backplane testing as shown in FIG. 2B.

In the step 245, a test data table is employed to iterate through a backplane test list in testing a pair of the hardware boards. In a decisional step 250, it is determined if a pair of hardware boards being addressed are usable for backplane testing as was recorded in the step 240. If either of the hardware boards is not usable for backplane testing, the method 200 returns to the step 245. If both hardware boards are usable for backplane testing, it is determined in a decisional step 255 if there is a predecessor test that has already been executed. If a predecessor test has been executed, the method 200 returns to the step 245 for further action.

If a predecessor test has not been executed, a backplane test is executed between specified hardware boards in a step 260. Then, a test result is stored and displayed, and diagnostic data is employed to quantify a failure in a step 265. Then, a decisional step 270 determines if all backplane tests have been performed. If all backplane tests have not been performed, the method 200 again returns to the step 245 for further action. If all backplane tests have been performed, the method 200 ends in a step 275.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order or the grouping of the steps is not a limitation of the present invention.

In summary, embodiments of the present invention employing a system for and a method of adaptable testing of backplane interconnections and a test tool employing the system or the method have been presented. Advantages include the ability, at run-time, to first determine how a collection of hardware boards are configured in a backplane arrangement and then apply all of the appropriate tests on at least pairs of boards based on the determined configuration. Additionally, data necessary to diagnose a failure identified by the testing may also be provided. Embodiments of the present invention typically allow application of all backplane tests to be accomplished in a matter of seconds as may be contrasted to hours or even days using a manual method of testing. Additionally, comparisons between commercially available boundary scan solutions for a given hardware board configuration has been determined to be about an order of magnitude slower than was achieved employing embodiments of the present invention for the same configuration.

Although the present invention has been described in detail, those skilled in the art should understand that they can make various changes, substitutions and alterations herein without departing from the spirit and scope of the invention in its broadest form.

What is claimed is:

1. A system for adaptable testing of backplane interconnections, comprising:
    a board detector configured to determine a relative arrangement of a plurality of hardware boards populating positions associated with said backplane interconnections; and
    a test coordinator coupled to said board detector and configured to adaptively backplane test at least a pair of said plurality of hardware boards based on said relative arrangement.

2. The system as recited in claim 1 further comprising a test database configured to provide a backplane positions table and a backplane test data table.

3. The system as recited in claim 1 wherein said board detector is further configured to determine whether each of said plurality of hardware boards is usable for backplane testing.

4. The system as recited in claim 3 wherein usability for backplane testing is determined by an addressing test, a path integrity test and a disable test.

5. The system as recited in claim 1 wherein said test coordinator is further configured to execute a predecessor test prior to backplane testing of said pair of said plurality of hardware boards.

6. The system as recited in claim 1 wherein backplane testing provides data necessary to diagnose a fault condition associated with at least one of said backplane interconnections and said plurality of hardware boards.

7. The system as recited in claim 6 wherein said data necessary to diagnose said fault condition is coordinated with a failure database to isolate a cause of said fault condition.

8. A method for adaptable testing of backplane interconnections, comprising:
   determining a relative arrangement of a plurality of hardware boards populating positions associated with said backplane interconnections; and
   adaptively backplane testing at least a pair of said plurality of hardware boards based on said relative arrangement wherein said testing correlates a fault condition with a hardware board of said plurality of hardware boards.

9. The method as recited in claim 8 further comprising a test database, said determining employing a backplane positions table and said adaptively backplane testing employing a backplane test data table, retrieved from said test database.

10. The method as recited in claim 8 further comprising determining whether each of said plurality of hardware boards is usable for backplane testing.

11. The method as recited in claim 10 wherein usability for backplane testing is determined by an addressing test, a path integrity test and a disable test.

12. The method as recited in claim 8 wherein said adaptively backplane testing is further configured to execute a predecessor test prior to backplane testing of said pair of said plurality of hardware boards.

13. The method as recited in claim 8 wherein backplane testing provides data necessary to diagnose a fault condition associated with at least one of said backplane interconnections and said plurality of hardware boards.

14. The method as recited in claim 13 wherein said data necessary to diagnose said fault condition is coordinated with a failure database to isolate a cause of said fault condition.

15. A test tool, comprising:
   a test database that provides a backplane positions table and a backplane test data table;
   a system for adaptable testing of backplane interconnections, including:
      a board detector that determines a relative arrangement of a plurality of hardware boards populating positions associated with said backplane interconnections, and
      a test coordinator, coupled to said board detector, that adaptively backplane tests at least a pair of said plurality of hardware boards based on said relative arrangement.

16. The test tool as recited in claim 15 wherein said board detector further determines whether each of said plurality of hardware boards is usable for backplane testing.

17. The test tool as recited in claim 16 wherein usability for backplane testing is determined by an addressing test, a path integrity test and a disable test.

18. The test tool as recited in claim 15 wherein said test coordinator further executes a predecessor test prior to backplane testing of said pair of said plurality of hardware boards.

19. The test tool as recited in claim 15 wherein backplane testing provides data necessary to diagnose a fault condition associated with at least one of said backplane interconnections and said plurality of hardware boards.

20. The test tool as recited in claim 19 wherein said data necessary to diagnose said fault condition is coordinated with a failure database to isolate a cause of said fault condition.

* * * * *